(12) United States Patent
Liu et al.

(10) Patent No.: US 10,497,620 B2
(45) Date of Patent: Dec. 3, 2019

(54) TFT SUBSTRATE AND MANUFACTURING METHOD THEREOF AND MANUFACTURING METHOD OF OLED PANEL

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Zhaosong Liu, Guangdong (CN); Yuanjun Hsu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 121 days.

(21) Appl. No.: 15/579,530

(22) PCT Filed: Nov. 25, 2017

(86) PCT No.: PCT/CN2017/112971
§ 371 (c)(1),
(2) Date: Dec. 4, 2017

(87) PCT Pub. No.: WO2019/071751
PCT Pub. Date: Apr. 18, 2019

(65) Prior Publication Data
US 2019/0229017 A1    Jul. 25, 2019

(30) Foreign Application Priority Data

Oct. 9, 2017   (CN) .......................... 2017 1 0931305

(51) Int. Cl.
H01L 21/77   (2017.01)
H01L 27/32   (2006.01)
H01L 27/12   (2006.01)
H01L 29/786  (2006.01)

(52) U.S. Cl.
CPC .......... *H01L 21/77* (2013.01); *H01L 27/1214* (2013.01); *H01L 27/1225* (2013.01);
(Continued)

(58) Field of Classification Search
None
See application file for complete search history.

(56) References Cited

U.S. PATENT DOCUMENTS 6,174,743 B1    1/2001  Pangrle et al.
8,530,273 B2 *  9/2013  Den Boer ......... H01L 29/78603
                                                    438/104

(Continued)

FOREIGN PATENT DOCUMENTS

CN   101681072   3/2010
CN   104716193   6/2015
(Continued)

*Primary Examiner* — J. E. Schoenholtz
(74) *Attorney, Agent, or Firm* — Hemisphere Law, PLLC; Zhigang Ma

(57) ABSTRACT

The present disclosure provides a TFT substrate and a manufacturing method thereof and a manufacturing method of an OLED panel. In the manufacturing method of the TFT substrate of the present disclosure, firstly formed a first inter layer dielectric covering the gate and the active layer on the buffer layer, wherein material of the first inter layer dielectric is provided as silicon oxynitride; Further, forming a second inter layer dielectric on the first inter layer dielectric, wherein material of the second inter layer dielectric is provided as silicon oxide, which can prevent excessive hydrogen elements from being introduced into the active layer, improve the working stability of the TFT device. The TFT substrate of the present disclosure is manufactured by (Continued)

using the above manufacturing method of a TFT substrate, the gate and the active layer have stable performance, and the TFT device has better working stability.

5 Claims, 9 Drawing Sheets

(52) U.S. Cl.
CPC ...... *H01L 27/1248* (2013.01); *H01L 27/1259* (2013.01); *H01L 27/3209* (2013.01); *H01L 27/3258* (2013.01); *H01L 29/78633* (2013.01); *H01L 2021/775* (2013.01)

(56) References Cited

U.S. PATENT DOCUMENTS

| | | | |
|---|---|---|---|
| 2002/0104995 A1* | 8/2002 | Yamazaki | H01L 27/3246 257/72 |
| 2003/0080436 A1* | 5/2003 | Ishikawa | G02F 1/136227 257/776 |
| 2005/0275038 A1* | 12/2005 | Shih | H01L 29/78633 257/382 |
| 2016/0218197 A1* | 7/2016 | Ryu | H01L 29/66757 |
| 2016/0307936 A1* | 10/2016 | Shin | H01L 27/1251 |
| 2016/0307978 A1* | 10/2016 | Liu | H01L 27/1274 |
| 2017/0017129 A1* | 1/2017 | Zhao | G02F 1/136204 |
| 2017/0179158 A1 | 6/2017 | Lee et al. | |
| 2017/0194415 A1* | 7/2017 | Choi | H01L 51/0096 |
| 2018/0301658 A1* | 10/2018 | Chung | H01L 51/5234 |
| 2018/0308984 A1* | 10/2018 | Liu | G02F 1/133514 |
| 2018/0331127 A1* | 11/2018 | Sasaki | H01L 27/1225 |
| 2019/0004641 A1* | 1/2019 | Huang | G06F 3/0412 |

FOREIGN PATENT DOCUMENTS

| | | |
|---|---|---|
| CN | 104882485 | 9/2015 |
| CN | 106486526 | 3/2017 |
| CN | 106571306 | 4/2017 |
| CN | 107134461 | 9/2017 |

* cited by examiner

TFT SUBSTRATE AND MANUFACTURING METHOD THEREOF AND MANUFACTURING METHOD OF OLED PANEL

RELATED APPLICATIONS

The present application is a National Phase of International Application Number PCT/CN2017/112971, filed on Nov. 25, 2017, and claims the priority of China Application 201710931305.8, filed on Oct. 9, 2017.

FIELD OF THE DISCLOSURE

The present disclosure relates to a display technology field, and more particularly to a TFT substrate and a manufacturing method thereof and a manufacturing method of an OLED panel.

BACKGROUND OF THE DISCLOSURE

Liquid crystal displays (LCD) have many advantages such as thin body, low power consumption and no radiation. They have been widely used, such as mobile phones, personal digital assistants (PDA), digital cameras, computer screens and laptop screens.

Organic Light-Emitting Diode (OLED) displays, also known as organic electroluminescent displays, are an emerging type of flat panel display device, due to its simple preparation process, low cost, low power consumption, high brightness, wide operating temperature range, thin, fast response, easy to achieve color display and large screen display, easy to implement and integrated circuit driver to match, easy to achieve the advantages of flexible display, which has broad application prospects.

According to the driving mode, the OLEDs can be divided into two types: a passive matrix OLED (PMOLED) and an active matrix OLED (AMOLED), namely direct addressing and thin film transistor (TFT) matrix addressing two categories. Wherein, AMOLED has a matrix arrangement of pixels, belonging to the active display type, high luminous efficiency, usually used for high-definition large-size display device.

Thin Film Transistors (TFTs) are the main driving elements in liquid crystal display devices and active matrix OLED display devices, and are directly related to the development direction of high-performance flat panel display devices. The thin film transistor has a variety of structures. The thin film transistor having a corresponding structure also has a variety of materials. Amorphous silicon (a-Si) is a more common material. However, as liquid crystal display devices and OLED display devices have been developed toward large size and high resolution, the mobility of the traditional a-Si is about 1 cm$^2$/(VS) and has been unable to meet the requirements, the metal oxide represented by indium gallium zinc oxide (IGZO) has a mobility of more than 10 cm$^2$/(Vs). Moreover, the preparation of the corresponding thin film transistor is compatible with the existing a-Si semiconductor-driven thin film transistor line and has rapidly become the focus of research and development in the field of display in recent years.

Top-Gate Self-Aligned Oxide Semiconductor TFTs are a common type of TFT in OLED panels, in the manufacturing process of the top-gate self-aligned oxide semiconductor TFT, it is usually necessary to cover the oxide semiconductor layer and the gate with an Inter Layer Dielectric (ILD). The material of the inter layer dielectric is generally selected from silicon nitride (SiN$_x$) and silicon oxide (SiO$_x$). Since the chemical vapor deposition process of silicon nitride needs to introduce ammonia (NH$_3$), ammonia easily introduces too much hydrogen into the oxide semiconductor layer, resulting in the deterioration of the performance of the oxide semiconductor layer. Therefore, in general, a silicon oxide material is selected in the art to form an inter layer dielectric, avoiding introduction of excessive hydrogen element in the oxide semiconductor layer. However, since the CVD process of silicon oxide needs to introduce nitrous oxide (N$_2$O), the nitrous oxide is easy to oxidize the copper metal on the gate surface to cause abnormal performance of the TFT device.

SUMMARY OF THE DISCLOSURE

An object of the present disclosure is to provide a manufacturing method of a TFT substrate capable of protecting copper on a gate surface not oxidized, ensuring the performance stability of the gate, and preventing excessive hydrogen from being introduced into the active layer, ensuring the performance stability of the active layer, and improving the working stability of the TFT device.

Another object of the present disclosure further provides a TFT substrate, which is obtained by the above manufacturing method of a TFT substrate, and the TFT device has better working stability.

The other object of the present disclosure is to provide a manufacturing method of an OLED panel. The TFT substrate is manufactured by using the above manufacturing method of a TFT substrate, which can ensure high working stability of the TFT device and ensure good light-emitting stability of the OLED panel.

In order to achieve the above object, the present disclosure provides a manufacturing method of a TFT substrate, including the steps of:

step S1, providing a base substrate, forming a light shielding layer on the base substrate, forming a buffer layer covering the light shielding layer on the base substrate, and forming an active layer corresponding to a top of the light shielding layer on the buffer layer, wherein material of the active layer is a metal oxide semiconductor material;

step S2, forming a gate insulating layer on the active layer, forming a gate on the gate insulating layer, and defining a channel area corresponding to a bottom of the gate insulating layer and a source contact area and a drain contact area respectively locating on two sides of the channel area on the active layer by the gate and the gate insulating layer, wherein the gate and the gate insulating layer are vertically aligned;

conducting a conductorizing process to the source contact area and the drain contact area of the active layer, so that the metal oxide semiconductor material of the source contact area and the drain contact area becomes a conductor, the metal oxide conductor material of the channel area maintains the semiconductor characteristics;

step S3, forming a first inter layer dielectric covering the gate and the active layer on the buffer layer; and forming a second inter layer dielectric on the first inter layer dielectric, wherein material of the first inter layer dielectric includes silicon oxynitride, and material of the second inter layer dielectric includes silicon oxide;

step S4, forming a first through hole and a second through hole corresponding to a top of the source contact area and a top of the drain contact area respectively on the first inter layer dielectric and the second inter layer dielectric;

forming a source and a drain on the second inter layer dielectric, and electrically connecting the source and the drain to the source contact area and the drain contact area of the active layer through the first through hole and the second through hole respectively to form the TFT substrate.

The silicon oxynitride is prepared by a chemical vapor deposition method, the reaction gas includes silane, ammonia and nitrous oxide; the silicon oxide is prepared by a chemical vapor deposition method; the reaction gas includes silane and nitrous oxide.

A thickness of the first inter layer dielectric is less than a thickness of the second inter layer dielectric.

The thickness of the first inter layer dielectric is 100 Å-500 Å, and the thickness of the second inter layer dielectric is 3000 Å-10000 Å.

The step S2 includes:

forming the gate insulating layer covering the active layer on the buffer layer, and depositing a gate metal layer on the gate insulating layer;

forming a photoresist layer on the gate metal layer, patterning the photoresist layer by photolithography process; and defining a gate pattern on the gate metal layer by the remaining photoresist layer;

using the photoresist layer as a barrier layer, and etching the gate metal layer to form the gate corresponding to a top of the active layer;

etching the gate insulating layer by using the photoresist layer and the gate as a barrier, leaving only a portion corresponding to a bottom of the gate, removing the other portions by etching, and defining the channel area corresponding to the bottom of the gate insulating layer and the source contact area and the drain contact area locating on both sides of the channel area respectively on the active layer by the gate and the gate insulating layer, wherein the remaining gate insulating layer is located on the active layer and aligned with the gate;

performing a plasma treatment on the active layer by using the photoresist layer, the gate and the gate insulating layer as a barrier layer, so that the metal oxide semiconductor material of the source contact area and the drain contact area becomes a conductor, the metal oxide semiconductor material of the channel area maintains the semiconductor characteristics; and removing the photoresist layer after the plasma treatment process is completed.

The present disclosure further provides a TFT substrate including: a base substrate, a light shielding layer arranged on the base substrate, a buffer layer arranged on the base substrate and covering the light shielding layer, an active layer arranged on the buffer layer and corresponding to a top of the light shielding layer, a gate insulating layer arranged on the active layer, a gate arranged on the gate insulating layer and aligned with the gate insulating layer, a first inter layer dielectric arranged on the buffer layer and covering the gate and the active layer, a second inter layer dielectric arranged on the first inter layer dielectric, and a source and a drain arranged on the second inter layer dielectric;

Material of the first inter layer dielectric includes silicon oxynitride, and material of the second inter layer dielectric includes silicon oxide;

the active layer includes a channel area corresponding to a bottom of the gate insulating layer and a source contact area and a drain contact area locating on both sides of the channel area respectively, wherein material of the source contact area and the drain contact area is conductorized metal oxide semiconductor material, and material of the channel area is a metal oxide semiconductor material that maintains semiconductor properties;

a first through hole and a second through hole respectively corresponding to a top of the source contact area and a top of the drain contact area are arranged on the first inter layer dielectric and the second inter layer dielectric; the source and the drain are electrically connected to the source contact area and the drain contact area of the active layer through the first through hole and the second through hole respectively.

A thickness of the first inter layer dielectric is less than a thickness of the second inter layer dielectric.

The thickness of the first inter layer dielectric is 100 Å-500 Å, and the thickness of the second inter layer dielectric is 3000 Å-10000 Å.

The present disclosure further provides a manufacturing method of an OLED panel, including the steps of:

step S10, manufacturing a TFT substrate according to the manufacturing method of a TFT substrate as described above.

step S20, forming a passivation layer covering the source and the drain on the second inter layer dielectric of the TFT substrate, and etching the passivation layer to form a via hole corresponding to a top of the source;

forming a planarization layer on the passivation layer, and forming a second via hole on the planarization layer by photolithography process, wherein the first via hole and the second via hole are vertically and correspondingly connected to each other and jointly form a third through hole;

step S30, forming an anode of an OLED, the anode of the OLED is in contact with the source through the third through hole;

step S40, forming a pixel defining layer on the planarization layer and the anode of the OLED, and forming an opening corresponding to a top of the anode of the OLED on the pixel defining layer by photolithography process;

step S50, forming an organic light emitting layer on the anode of the OLED in the opening;

step S60, forming a cathode on the organic light emitting layer in the pixel defining layer and the opening.

The beneficial effects of the present disclosure are as follows: in the manufacturing method of the TFT substrate of the present disclosure, firstly formed a first inter layer dielectric covering the gate and the active layer on the buffer layer, wherein material of the first inter layer dielectric is provided as silicon oxynitride, so that the copper on the surface of the gate can be protected from being oxidized to ensure performance stability of the gate while preventing excessive hydrogen element from being introduced into the active layer; Further, forming a second inter layer dielectric on the first inter layer dielectric, wherein material of the second inter layer dielectric is provided as silicon oxide, which can prevent excessive hydrogen elements from being introduced into the active layer, ensure the stable performance of the active layer, and improve the working stability of the TFT device. The TFT substrate of the present disclosure is manufactured by using the above manufacturing method of a TFT substrate, the gate and the active layer have stable performance, and the TFT device has better working stability. According to the manufacturing method of an OLED panel of the present disclosure, a TFT substrate is manufactured by using the above manufacturing method of a TFT substrate, thereby ensuring high working stability of the TFT device and ensuring good light-emitting stability of the OLED panel.

For further understanding of the features and technical contents of the present disclosure, reference should be made to the following detailed description and accompanying drawings of the present disclosure. However, the drawings are for reference only and are not intended to limit the present disclosure.

BRIEF DESCRIPTION OF THE DRAWINGS

The technical solutions of the present disclosure and other beneficial effects will be apparent from the following detailed description of specific embodiments of the present disclosure with reference to the accompanying drawings.

DETAILED DESCRIPTION OF PREFERRED EMBODIMENTS

To further illustrate the technical means adopted by the present disclosure and the effects thereof, the following describes in detail the preferred embodiments of the present disclosure and the accompanying drawings.

Figure 1:
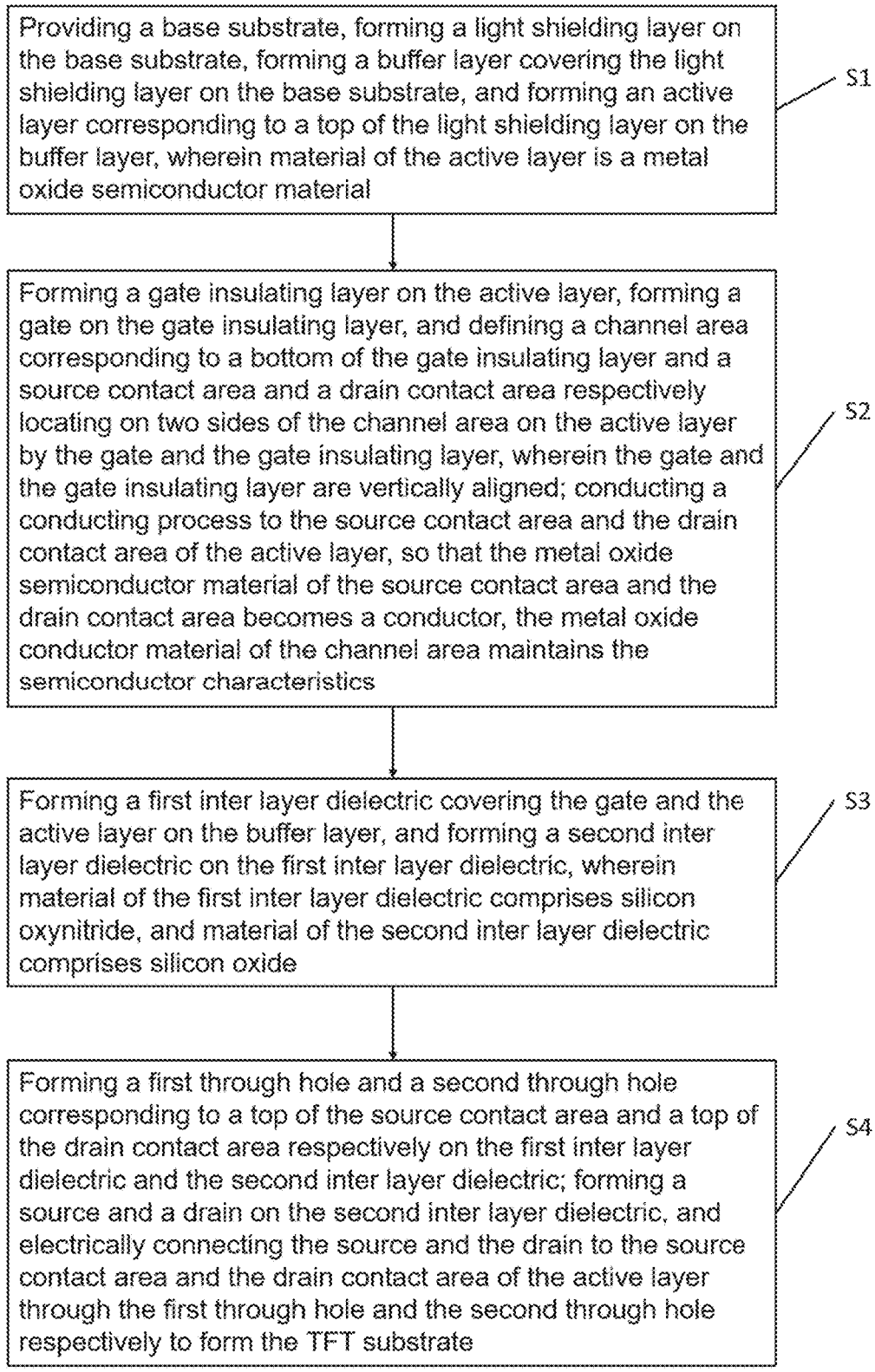
FIG. 1 is a flowchart of a manufacturing method of a TFT substrate of the present disclosure.
Figure 2:
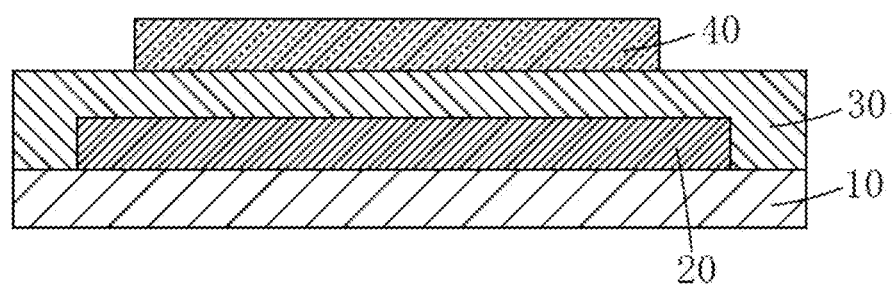
FIG. 2 is a schematic diagram of the step S1 of the manufacturing method of a TFT substrate of the present disclosure.

Referring to FIG. 1, the present disclosure provides a manufacturing method of a TFT substrate including the steps of:

step S1, as shown in FIG. 2, providing a base substrate 10, forming a light shielding layer 20 on the base substrate 10, forming a buffer layer 30 covering the light shielding layer 20 on the base substrate 10, forming an active layer 40 corresponding to a top of the light shielding layer 20 on the buffer layer 30, wherein material of the active layer 40 is a metal oxide semiconductor material.

Specifically, before forming the light shielding layer 20, cleaning the base substrate 10.

Specifically, depositing a layer of a metal on the base substrate 10 by photolithography process and etching process to obtain the light shielding layer 20.

Specifically, the area of the light shielding layer 20 is greater than the area of the active layer 40, and an orthogonal projection of the light shielding layer 20 on the base substrate 10 covers an orthogonal projection of the active layer 40 on the base substrate 10, so that the light shielding layer 20 completely covers the active layer 40 to prevent the active layer 40 from being negatively-flooded by the threshold voltage of the TFT due to light irradiation, so as to improve the working stability of the TFT.

Specifically, the base substrate 10 is a glass substrate.

Specifically, the thickness of the light shielding layer 20 is 500 Å-2000 Å, the material of the light shielding layer 20 is metal; preferably; the material of the light shielding layer 20 includes molybdenum (Mo), aluminum (Al), copper (Cu), Titanium (Ti) of one or more of the alloy.

Specifically, the thickness of the buffer layer 30 is 1000 Å-5000 Å, the material of the light shielding layer includes silicon oxide ($SiO_x$).

Specifically, the thickness of the active layer 40 is 100 Å-1000 Å, the metal oxide semiconductor material includes one or more of IGZO, IZTO, and IGZTO.

step S2; as shown in FIG. 3 to FIG. 8; forming a gate insulating layer 50 on the active layer 40, forming a gate 60 on the gate insulating layer 50, defining a channel area 41 corresponding to a bottom of the gate insulating layer 50 and a source contact area 42 and a drain contact area 43 locating on two sides of the channel area 41 respectively on the active layer 40 by the gate 60 and the gate insulating layer 50;

conducting a conductorizing process to the source contact area 42 and the source contact area 43 of the active layer 40, so that the metal oxide semiconductor material of the source contact area 42 and the drain contact area 43 becomes a conductor, the metal oxide conductor material of the channel area 41 maintains the semiconductor characteristics.

Figure 3:
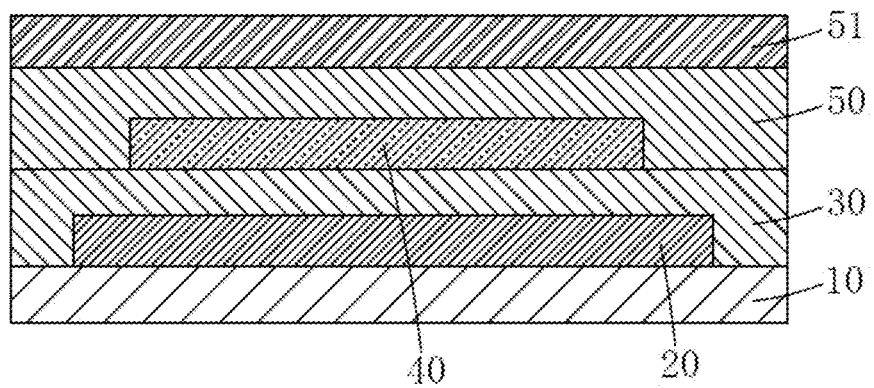
FIG. 3 to FIG. 8 are schematic diagrams of step S2 of the manufacturing method of a TFT substrate according to the present disclosure.
Figure 4:
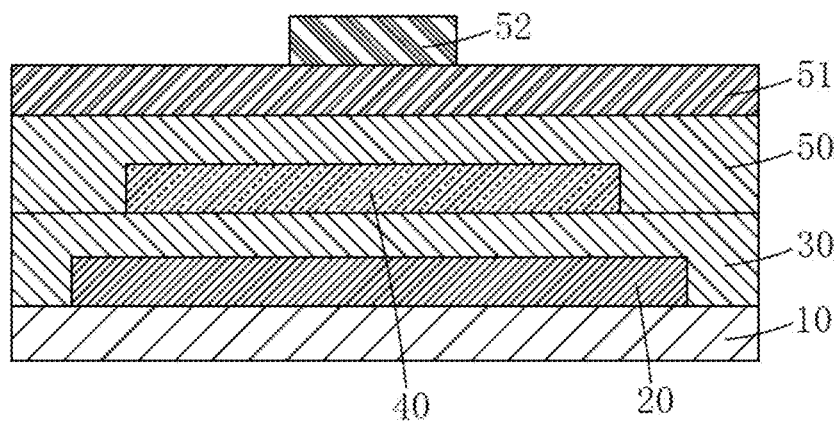
Figure 5:
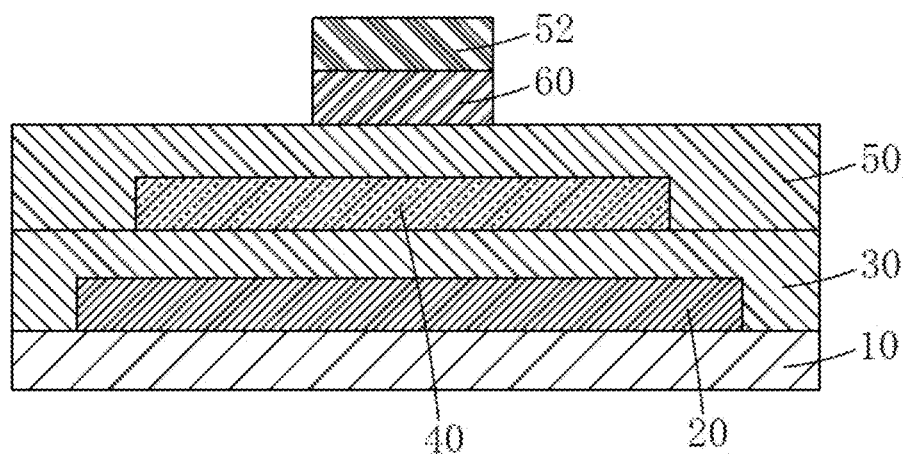
Figure 6:
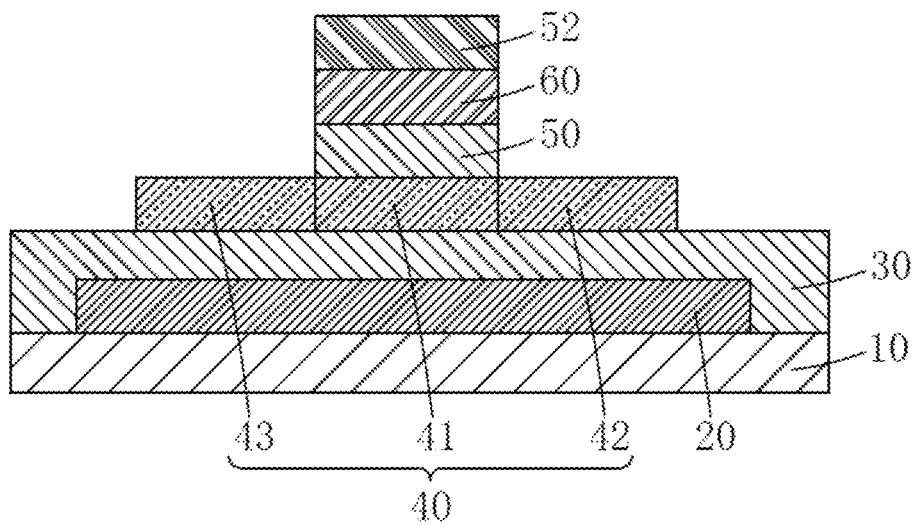
Figure 7:
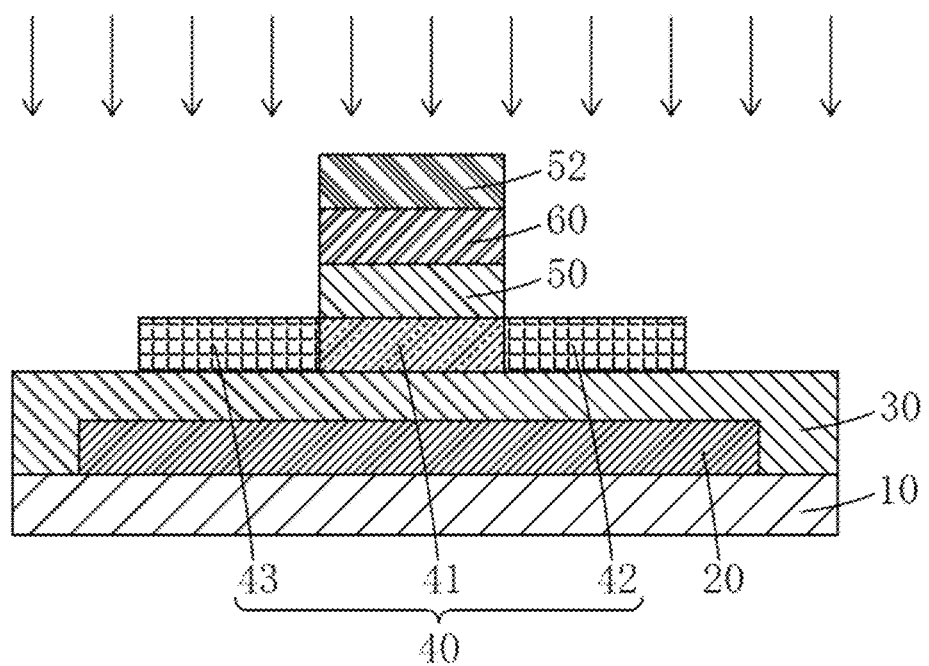
Figure 8:
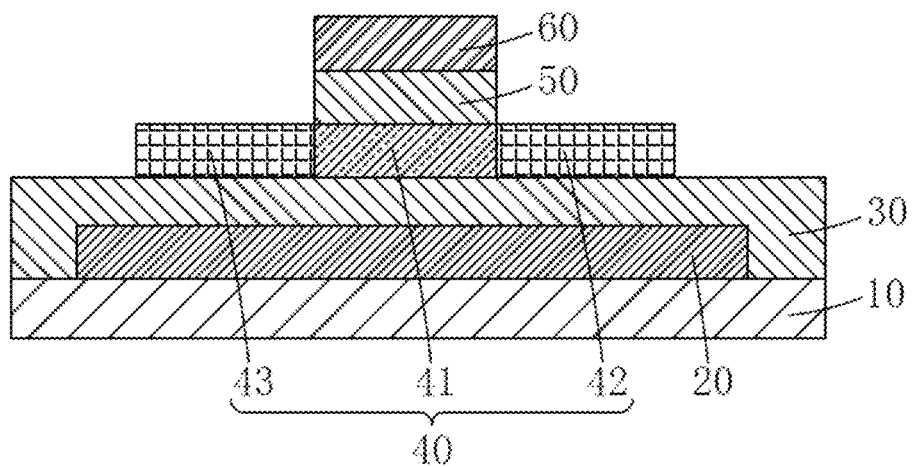

Specifically, the step S2 includes:

As shown in FIG. 3, forming a gate insulating layer 50 covering the active layer 40 on the buffer layer 30, and depositing a gate metal layer 51 on the gate insulating layer 50;

As shown in FIG. 4, forming a photoresist layer 52 on the gate metal layer 51, patterning the photoresist layer 52 by photolithography process, defining a gate pattern on the gate metal layer 51 by the remaining photoresist layer 52;

As shown in FIG. 5, using the photoresist layer 52 as a barrier layer, and etching the gate metal layer 51 to form the gate 60 corresponding to a top of the active layer 40;

As shown in FIG. 6, etching the gate insulating layer 50 by using the photoresist layer 52 and the gate 60 as a barrier, leaving only a portion corresponding to a bottom of the gate 60, removing the other portions by etching, and defining the channel area 41 corresponding to the bottom of the gate insulating layer 50 and the source contact area 42 and the drain contact area 43 locating on both sides of the channel area 41 respectively on the active layer 40 by the gate 60 and the gate insulating layer 50, wherein the remaining gate insulating layer 50 is located on the active layer 40 and aligned with the gate 60;

As shown in FIG. 7, performing a plasma treatment on the active layer 40 by using the photoresist layer 52, the gate 60 and the gate insulating layer 50 as a barrier layer, so that the metal oxide semiconductor material of the source contact area 42 and the drain contact area 43 becomes a conductor, the metal oxide semiconductor material of the channel area 41 maintains the semiconductor characteristics; and removing the photoresist layer 52 after the plasma treatment process is completed, as shown in FIG. 8.

After the plasma treatment on the active layer 40, the content of oxygen element in the metal oxide semiconductor material of the source contact area 42 and the drain contact area 43 can be reduced to reduce the resistivity of the metal oxide semiconductor material to become the conductor.

Specifically, the thickness of the gate insulating layer 50 is 1000 Å-3000 Å, the material of the gate insulating layer 50 includes silicon oxide ($SiO_x$).

Specifically, the thickness of the gate 60 is 2000 Å-8000 Å, the gate 60 includes a first gate layer arranged on the gate insulating layer 50 and a second gate layer arranged on the first gate layer, the material of the first gate layer is molybdenum (Mo), titanium (Ti), or molybdenum-titanium alloy, and the material of the second gate layer is copper (Cu).

Specifically, the plasma includes one or more of helium plasma, argon plasma, and ammonia plasma.

Specifically, when material of the metal oxide semiconductor is indium gallium zinc oxide (IGZO), before the plasma treatment, the indium gallium zinc oxide has a molar ratio of In:Ga:Zn:O=1:1:1:$X_1$, wherein $X_1$ is between 1 and 10, after the plasma treatment, the indium gallium zinc oxide has a molar ratio of In:Ga:Zn:O=1:1:1:$X_2$, wherein $X_2$ is less than 1. Therefore, after the plasma treatment of the active layer 40, the molar ratio of indium gallium zinc oxide in the source contact area 42 and the drain contact area 43 of the active layer 40 is In:Ga:Zn:O=1:1:1:$X_2$, wherein $X_2$ is less than 1, the molar ratio of indium gallium zinc oxide in the channel area 41 of the active layer 40 is In:Ga:Zn:O=1:1:1:$X_1$, wherein $X_1$ is between 1 and 10.

Figure 9:
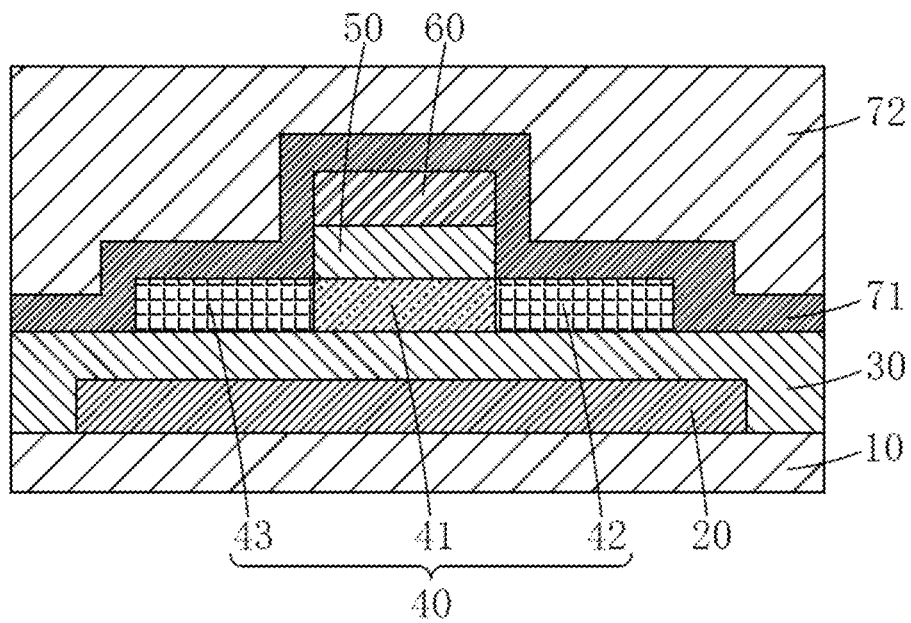
FIG. 9 is a schematic diagram of step S3 of the manufacturing method of a TFT substrate according to the present disclosure.

The present disclosure adopts a top-gate self-aligned structure, defining the channel area 41 corresponding to the bottom of the gate insulating layer 50 and the source contact area 42 and the drain contact area 43 locating on two sides of the channel area 41 respectively on the active layer 40 by the gate 60 and the gate insulating layer 50. During the plasma processing of the active layer 40, the gate 60 and the gate insulating layer 50 can protect the channel area 41 of the active layer 40 not conductorized.

step S3, as shown in FIG. 9, forming a first inter layer dielectric 71 covering the gate 60 and the active layer on the buffer layer 30, the material of the first inter layer dielectric 71 includes silicon oxynitride ($SiO_xN_y$);

forming a second inter layer dielectric 72 on the first inter layer dielectric 71, the material of the second inter layer dielectric 72 includes silicon oxide ($SiO_x$).

Specifically, the silicon oxynitride is prepared by a chemical vapor deposition method, the reaction gas includes silane, ammonia ($NH_3$) and nitrous oxide ($N_2O$). The silane is preferably monosilane ($SiH_4$).

Specifically, the silicon oxide is prepared by a chemical vapor deposition method, the reaction gas includes silane and nitrous oxide ($N_2O$). The silane is preferably monosilane ($SiH_4$).

Specifically, the thickness of the first inter layer dielectric 71 is less than the thickness of the second inter layer dielectric 72.

Preferably, the thickness of the first inter layer dielectric 71 is 100 Å-500 Å, the thickness of the second inter layer dielectric 72 is 3000 Å-10000 Å.

Reaction gas used in chemical vapor deposition process of silicon nitride ($SiN_x$) includes silane and ammonia ($NH_3$), wherein ammonia easily introduces hydrogen into the active layer 40, resulting in deterioration of the performance of the metal oxide semiconductor material, the chemical vapor deposition process of the silicon oxide ($SiO_x$) needs to introduce nitrous oxide ($N_2O$), so it is easy to oxidize the copper on the surface of the gate 60; the present disclosure provides the material of the first inter layer dielectric 71 as silicon oxynitride, compared with silicon oxide, the introduction of nitrous oxide is reduced, the copper on the surface of the gate 60 is protected from being oxidized, compared with silicon nitride, introduction of ammonia gas is reduced, preventing excessive hydrogen element from being introduced into the active layer 40; the present disclosure provides the material of the second inter layer dielectric 72 as silicon oxide, compared with silicon nitride, introduction of ammonia gas can be avoided to prevent excessive hydrogen element from being introduced into the active layer 40, ensuring stable performance of the active layer 40 and improving working stability of the TFT device.

Figure 10:
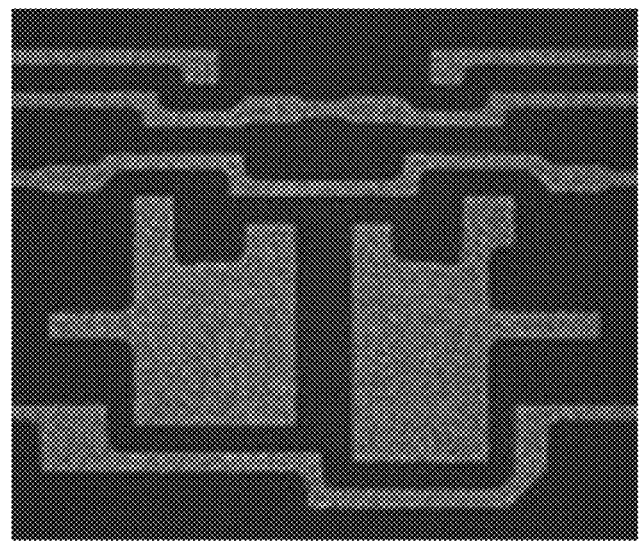
FIG. 10 is a microscopic photograph of a conventional top-gate self-aligned oxide semiconductor TFT after an inter layer dielectric made of a silicon oxide material is formed.
Figure 11:
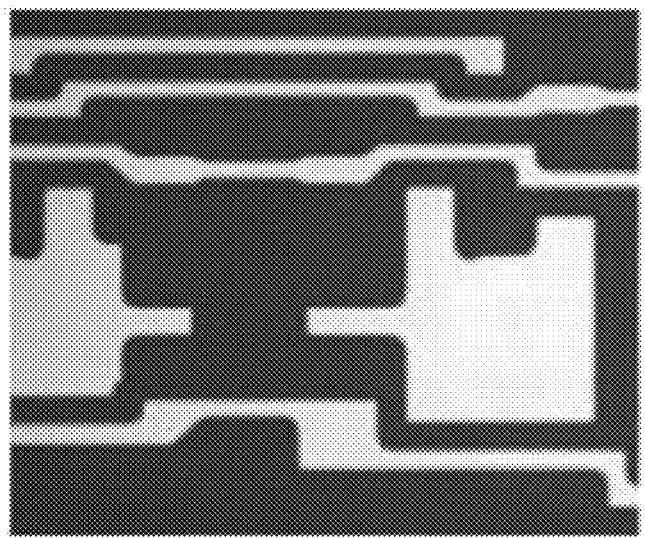
FIG. 11 is a microscope photograph of a second inter layer dielectric after the manufacturing method of a TFT substrate according to the present disclosure is completed.
Figure 12:
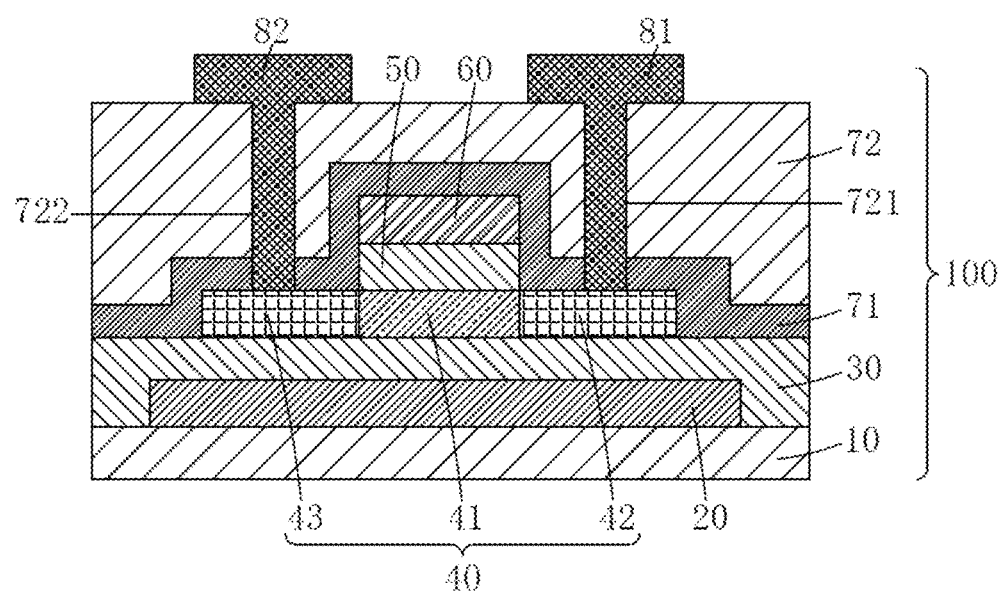
FIG. 12 is a schematic diagram of step S4 of the manufacturing method of a TFT substrate according to the present disclosure and a schematic structural diagram of the TFT substrate of the present disclosure.

FIG. 10 is a microscopic photograph of a conventional top-gate self-aligned oxide semiconductor TFT after an inter layer dielectric made of a silicon oxide material is formed. Can be seen from FIG. 10, the copper on the surface of the gate metal layer (gray area) is seriously oxidized and the surface of the gate metal layer is rough and uneven, so that the performance of the TFT device easily deteriorates and the operation is unstable. FIG. 11 is a microscope photograph of a second inter layer dielectric after the manufacturing method of a TFT substrate according to the present disclosure is completed. Can be seen from FIG. 11, the copper on the surface of the gate metal layer (white area) is substantially not oxidized, and the surface of the gate metal layer is smooth, ensuring the working stability of the TFT device.

step S4, as shown in FIG. 12, forming a first through hole 721 and a second through hole 722 corresponding to the top of the source contact area 42 and the top of the drain contact area 43 respectively on the first inter layer dielectric 71 and the second inter layer dielectric layer 72;

forming a source 81 and a drain 82 on the second inter layer dielectric 72, and electrically connecting the source 81 and the drain 82 to the source contact area 42 and the drain contact area 43 of the active layer 40 through the first through hole 721 and the second through hole 722 respectively to obtain the TFT substrate 100.

Specifically, forming the source 81 and the drain 82 by depositing a metal layer on the second inter layer dielectric 72 and patterning.

Specifically, the thickness of the source 81 and the drain 82 are both 2000 Å-8000 Å, each of the source 81 and the drain 82 includes a first metal layer arranged on the second inter layer dielectric 72 and a second metal layer arranged on the first metal layer. The material of the first metal layer is molybdenum (Mo), titanium (Ti), or molybdenum-titanium alloy, and the material of the second metal layer is copper (Cu).

The TFT manufactured by the above manufacturing method a TFT substrate is a top-gate self-aligned oxide semiconductor TFT. That is, theoretically, the gate 60 and the gate insulating layer 50 are vertically aligned and the same in size. However, the size of the gate 60 made in actual production is usually slightly smaller than the size of the gate insulating layer 50. Therefore, the technical feature of "the gate 60 and the gate insulating layer 50 are vertically aligned" described in this application is merely used to indicate that the TFT of the present application has a top-gate self-aligned structure, it does not mean that "there is no difference in size between the gate 60 and the gate insulating layer 50", and in the same manner as the concept of the present disclosure, and the TFT structure and the manufacturing method using the top-gate self-alignment process all belong to the protection scope of the present disclosure.

In the manufacturing method of a TFT substrate, firstly forming a first inter layer dielectric 71 covering the gate 60 and the active layer 40 on the buffer layer 30, and providing the material of the first inter layer dielectric 71 as silicon oxynitride, the copper metal on the surface of the gate 60 can be protected from being oxidized to ensure the stable performance of the gate 60 while preventing excessive hydrogen from being introduced into the active layer 40;

further, forming a second inter layer dielectric 72 on the first inter layer dielectric 71, and providing the material of the second inter layer dielectric 72 as silicon oxide, it is possible to prevent excessive hydrogen element from being introduced into the active layer 40 and to ensure the stable performance of the active layer 40 and to improve the working stability of the TFT device.

Please referring to FIG. 12, based on the above manufacturing method a TFT substrate, the present disclosure further provides a TFT substrate 100, including: a base substrate 10, a light shielding layer 20 arranged on the base substrate 10, a buffer layer 30 arranged on the base substrate 10 and covering the light shielding layer 20, an active layer 40 arranged on the buffer layer 30 and corresponding to a top of the light shielding layer 20, a gate insulating layer 50 arranged on the active layer 40, a gate 60 arranged on the gate insulating layer 50 and aligned with the gate insulating layer 50, a first inter layer dielectric 71 arranged on the buffer layer 30 and covering the gate 60 and the active layer 40, a second inter layer dielectric 72 arranged on the first inter layer dielectric 71, and a source 81 and a drain 82 arranged on the second inter layer dielectric 72;

wherein material of the first inter layer dielectric 71 includes silicon oxynitride, and material of the second inter layer dielectric 72 includes silicon oxide;

the active layer 40 includes a channel area 41 corresponding to a bottom of the gate insulating layer 50 and a source contact area 42 and a drain contact area 43 locating on both sides of the channel area 41 respectively, wherein material of the source contact area 42 and the drain contact area 43 is conductorized metal oxide semiconductor material, and material of the channel area 41 is a metal oxide semiconductor material that maintains semiconductor properties;

a first through hole 721 and a second through hole 722 respectively corresponding to a top of the source contact area 42 and a top of the drain contact area 43 are arranged on the first inter layer dielectric 71 and the second inter layer dielectric 72; the source 81 and the drain 82 are electrically connected to the source contact area 42 and the drain contact area 43 of the active layer 40 through the first through hole 721 and the second through hole 722 respectively.

Specifically, the area of the light shielding layer 20 is greater than the area of the active layer 40, and an orthogonal projection of the light shielding layer 20 on the base substrate 10 covers an orthogonal projection of the active layer 40 on the base substrate 10, so that the light shielding layer 20 completely covers the active layer 40 to prevent the active layer 40 from being negatively-flooded by the threshold voltage of the TFT due to light irradiation, so as to improve the working stability of the TFT.

Specifically, the base substrate 10 is a glass substrate.

Specifically, the thickness of the light shielding layer 20 is 500 Å-2000 Å, the material of the light shielding layer 20 is metal; preferably, the material of the light shielding layer 20 includes molybdenum (Mo), aluminum (Al), copper (Cu), Titanium (Ti) of one or more of the alloy.

Specifically, the thickness of the buffer layer 30 is 1000 Å-5000 Å, the material of the light shielding layer includes silicon oxide ($SiO_x$).

Specifically, the thickness of the active layer 40 is 100 Å-1000 Å, the metal oxide semiconductor material includes one or more of IGZO, IZTO, and IGZTO.

Specifically, the thickness of the gate insulating layer 50 is 1000 Å-3000 Å, the material of the gate insulating layer 50 includes silicon oxide ($SiO_x$).

Specifically, the thickness of the gate 60 is 2000 Å-8000 Å, the gate 60 includes a first gate layer arranged on the gate insulating layer 50 and a second gate layer arranged on the first gate layer, the material of the first gate layer is molybdenum (Mo), titanium (Ti), or molybdenum-titanium alloy, and the material of the second gate layer is copper (Cu).

Specifically, the thickness of the source 81 and the drain 82 are both 2000 Å-8000 Å, each of the source 81 and the drain 82 includes a first metal layer arranged on the second inter layer dielectric 72 and a second metal layer arranged on the first metal layer. The material of the first metal layer is molybdenum (Mo), titanium (Ti), or molybdenum-titanium alloy, and the material of the second metal layer is copper (Cu).

Specifically, when material of the metal oxide semiconductor is indium gallium zinc oxide (IGZO), the indium gallium zinc oxide of the source contact area 42 and the drain contact area 43 of the active layer 40 has a molar ratio of In:Ga:Zn:O=1:1:1:$X_2$, wherein $X_2$ is less than 1, the indium gallium zinc oxide of the channel area 41 of the active layer 40 has a molar ratio of In:Ga:Zn:O=1:1:1:$X_1$, wherein $X_1$ is between 1 and 10.

Specifically, the thickness of the first inter layer dielectric 71 is less than the thickness of the second inter layer dielectric 72.

Preferably, the thickness of the first inter layer dielectric 71 is 100 Å-500 Å, the thickness of the second inter layer dielectric 72 is 3000 Å-10000 Å.

The TFT substrate provides material of the first inter layer dielectric 71 covering the gate 60 and the active layer 40 on the buffer layer 30 as silicon oxynitride to protect the copper on the surface of the gate 60 from being oxidized, to ensure the stable performance of the gate 60 while preventing excessive hydrogen element from being introduced into the active layer 40; further, the material of the second inter layer dielectric 72 arranged on the first inter layer dielectric 71 is provided as silicon oxide, too much hydrogen can be prevented from being introduced into the active layer 40 to ensure the stable performance of the active layer 40 and improve the working stability of the TFT device.

Figure 13:
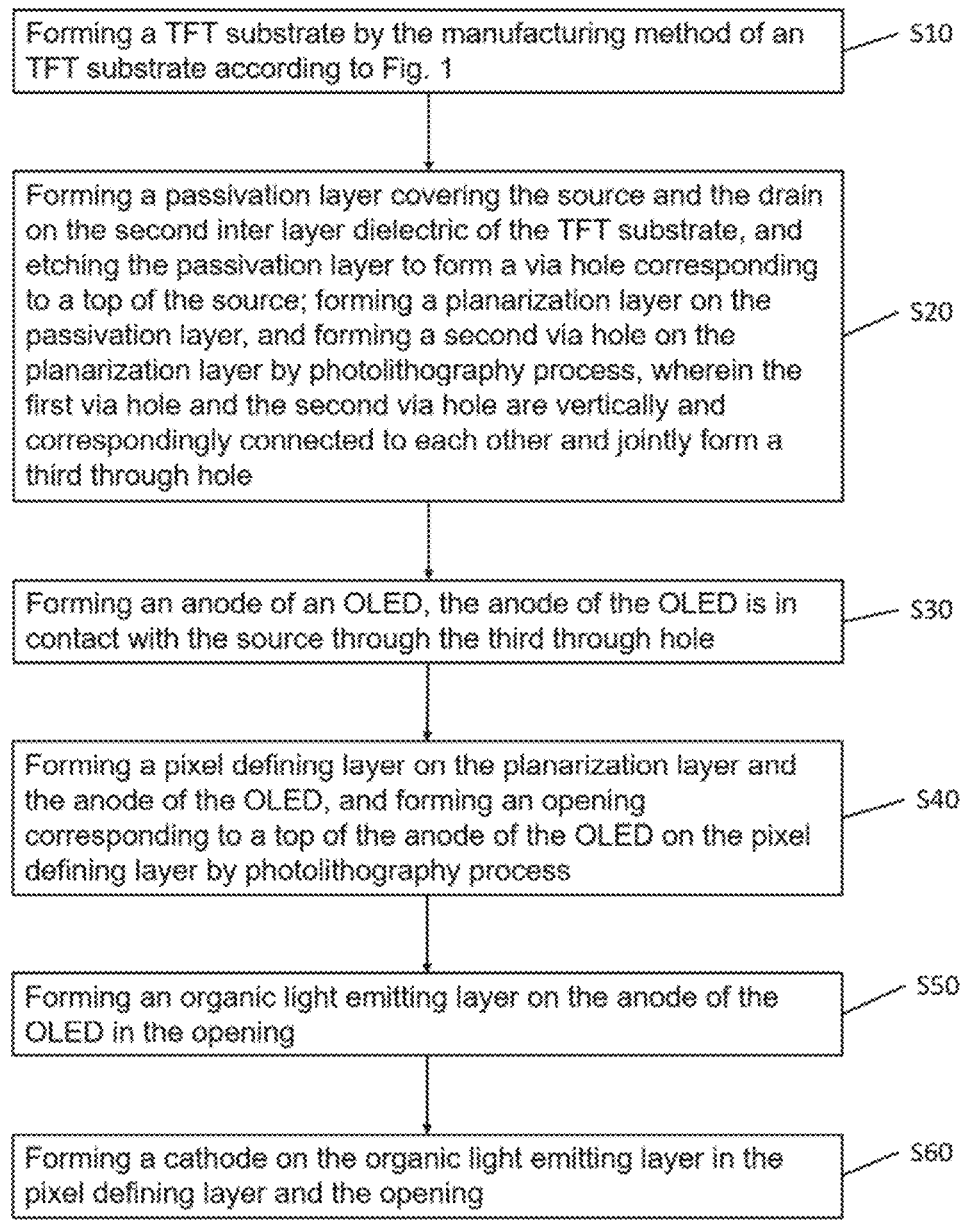
FIG. 13 is a flow chart of a manufacturing method of an OLED panel of the present disclosure.
Figure 14:
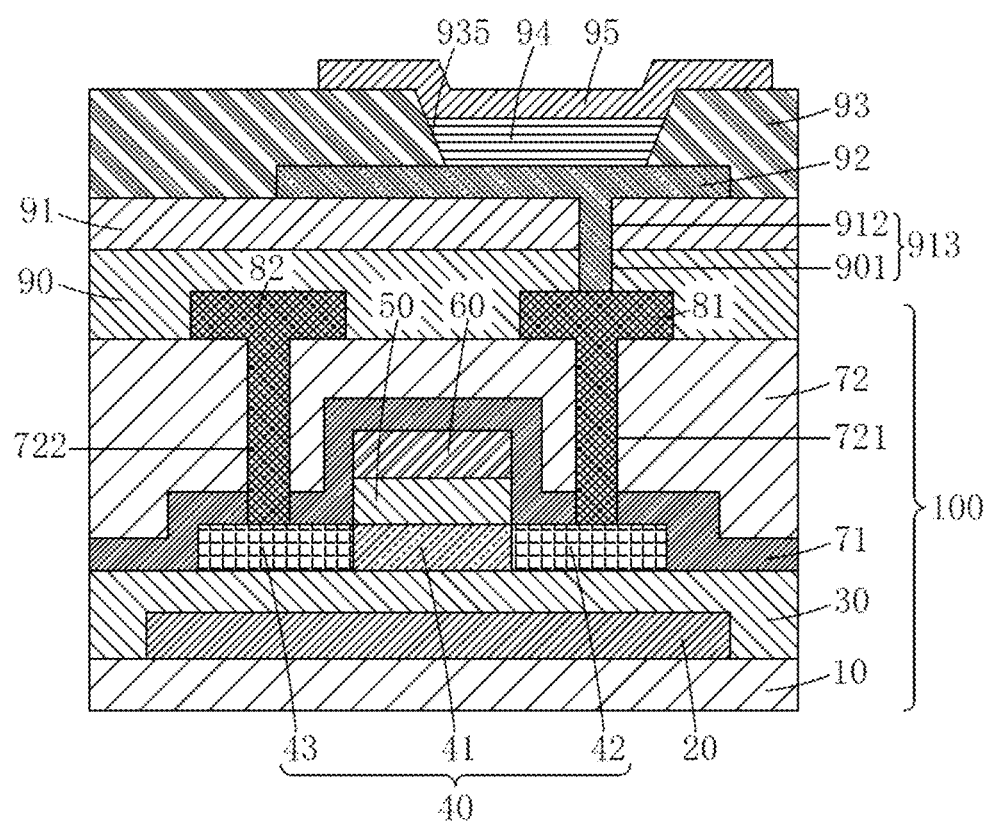
FIG. 14 is a schematic diagram of steps S20 to S60 of the manufacturing method of an OLED panel of the present disclosure and a schematic structural diagram of the OLED panel of the present disclosure.

Please referring to FIG. 13, based on the above manufacturing method of a TFT substrate, the present disclosure further provides a manufacturing method of an OLED panel, including the steps of:

step S10, please referring to FIG. 1 to FIG. 12, forming the TFT substrate 100 according to the manufacturing method of a TFT substrate described above.

step S20, please referring to FIG. 14, forming a passivation layer 90 covering the source 81 and the drain 82 on the second inter layer dielectric 72 of the TFT substrate 100, and etching the passivation layer 90 to form a first via hole 901 corresponding to the top of the source 81;

forming a planarization layer 91 on the passivation layer 90, and forming a second via hole 912 on the planarization 91 by photolithography process, the first via hole 901 and the second via hole 912 are vertically and correspondingly connected to each other and jointly form a third through hole 913;

Specifically, the thickness of the passivation layer 90 is 1000 Å-5000 Å, material of the passivation layer 90 includes silicon oxide ($SiO_x$).

Specifically, the thickness of the planarization layer 91 is 10000 Å-20000 Å, material of the planarization layer 91 is organic photoresist material, the composition and type of the organic photoresist material are not limited.

step S30, please referring to FIG. 14, forming an anode of an OLED 92 on the planarization layer 91, the anode of the OLED 92 is in contact with the source 81 through the third through hole 913.

Specifically, the thickness of the anode of the OLED 92 is 500 Å-1000 Å, material of the anode of the OLED 92 includes transparent conductive metal oxide, the transparent conductive metal oxide is preferably indium tin oxide (ITO).

step S40, please referring to FIG. 14, forming a pixel defining layer 93 on the anode of the OLED 92 and the planarization layer 91, and forming an opening 935 corresponding to a top of the anode of the OLED 92 on the pixel defining layer 93 by photolithography process;

Specifically, the thickness of the pixel defining layer 93 is 10000 Å-20000 Å, material of the pixel defining layer 93 is organic photoresist material, the composition and type of the organic photoresist material are not limited.

Specifically, the area of the opening 935 is less than the area of the anode of the OLED 92 to ensure the bottom of the opening 935 is covered with anode material.

step S50, please referring to FIG. 14, forming an organic light emitting layer 94 on the anode of the OLED 92 in the opening 935.

Specifically, the organic light emitting layer 94 includes a hole injection layer, a hole transport layer, a light emitting layer, and an electron transport layer that are sequentially stacked from the bottom to the top on the anode of the OLED 92.

Specifically, the organic light emitting layer 94 is fabricated by vapor deposition or ink-jet printing (IJP) technology.

step S60, please referring to FIG. 14, forming a cathode 95 on the organic light emitting layer 94 in the pixel defining layer 93 and the opening 935. So far, the production of the OLED panel is completed.

Specifically, material of the cathode is metal, preferably silver.

Specifically, the cathode 95 has a sufficiently thin thickness and good light transmittance such that light emitted by the organic light emitting layer 94 can be emitted from the cathode 95.

The manufacturing method of an OLED panel adopts the manufacturing method of a TFT substrate to fabricate a TFT substrate, which can ensure the stable performance of the gate 60 and the active layer, improve the working stability of the TFT device, and ensure the OLED panel with better light emitting stability.

Please referring to FIG. 14, based on the above manufacturing method of an OLED panel, the present disclosure further provides an OLED panel, including: a TFT substrate 100 as described above, a passivation layer 90 covering the source 81 and the drain 82 on the second inter layer dielectric 72 of the TFT substrate 100, a planarization layer 91 arranged on the passivation layer 90, an anode of an OLED 92 arranged on the planarization layer 91, a pixel defining layer 93 arranged on the planarization layer 91 and the anode of the OLED 92, an opening 935 corresponding to a top of the anode of the OLED 92 and arranged on the pixel defining layer 93, an organic light emitting layer 94 arranged on the anode of the OLED 92 and in the opening 935, and a cathode 95 arranged on the pixel defining layer 93 and the organic light emitting layer 94;

wherein a third through hole 913 corresponding to a top of the source 81 is arranged on the passivation layer 90 and the planarization layer 91, and the anode of the OLED 92 is in contact with the source 81 through the third through hole 913.

Specifically, the third through hole 913 includes a first via hole 901 arranged on the passivation layer 90 and a second via hole 912 arranged on the planarization layer 91, the first via hole 902 and the second via hole 912 are vertically and correspondingly connected to each other.

Specifically, the area of the opening 935 is less than the area of the anode of the OLED 92 to ensure the bottom of the opening covered with anode material.

Specifically, the organic light emitting layer 94 includes a hole injection layer, a hole transport layer, a light emitting layer, and an electron transport layer that are sequentially stacked from the bottom to the top on the anode of the OLED 92.

Specifically, material of the cathode is metal, preferably silver.

The above-mentioned OLED panel includes the above-mentioned TFT substrate, the performance of the gate 60 and the active layer 40 is stable, and the TFT device has better working stability. Therefore, the OLED panel has better light emitting stability.

In summary, the present disclosure provides a TFT substrate and a manufacturing method thereof and a manufacturing method of an OLED panel. In the manufacturing method of the TFT substrate of the present disclosure, firstly formed a first inter layer dielectric covering the gate and the active layer on the buffer layer, wherein material of the first inter layer dielectric is provided as silicon oxynitride, so that the copper on the surface of the gate can be protected from being oxidized to ensure performance stability of the gate while preventing excessive hydrogen element from being introduced into the active layer; Further, forming a second inter layer dielectric on the first inter layer dielectric, wherein material of the second inter layer dielectric is provided as silicon oxide, which can prevent excessive hydrogen elements from being introduced into the active layer, ensure the stable performance of the active layer, and improve the working stability of the TFT device. The TFT substrate of the present disclosure is manufactured by using the above manufacturing method of a TFT substrate, the gate and the active layer have stable performance, and the TFT device has better working stability. According to the manufacturing method of an OLED panel of the present disclosure, a TFT substrate is manufactured by using the above manufacturing method of a TFT substrate, thereby ensuring high working stability of the TFT device and ensuring good light-emitting stability of the OLED panel. The OLED panel of the present disclosure includes the TFT substrate described above, and the TFT device thereof has a better working stability. Therefore, the OLED panel has better light-emitting stability.

For those skilled in the art, various other appropriate changes and modifications may be made according to the technical solutions and technical solutions of the present disclosure, and all such changes and modifications shall fall within the protection scope of the appended claims of the present disclosure.

What is claimed is:

1. A manufacturing method of an OLED panel, comprising the following steps:
   step S10, forming a TFT substrate by steps of:
   step S1, providing a base substrate, forming a light shielding layer on the base substrate, forming a buffer layer covering the light shielding layer on the base substrate, and forming an active layer corresponding to a top of the light shielding layer on the buffer layer, wherein material of the active layer is a metal oxide semiconductor material;
   step S2, forming a gate insulating layer on the active layer, forming a gate on the gate insulating layer, and defining a channel area corresponding to a bottom of the gate insulating layer, and a source contact area and a drain contact area respectively locating on two sides of the channel area on the active layer by the gate and the gate insulating layer, wherein the gate and the gate insulating layer are vertically aligned;

conducting a conductorizing process to the source contact area and the drain contact area of the active layer, so that the metal oxide semiconductor material of the source contact area and the drain contact area becomes a conductor, the metal oxide conductor material of the channel area maintains the semiconductor characteristics;

step S3, forming a first inter layer dielectric covering the gate and the active layer on the buffer layer, and forming a second inter layer dielectric on the first inter layer dielectric, wherein material of the first inter layer dielectric comprises silicon oxynitride, and material of the second inter layer dielectric comprises silicon oxide;

step S4, forming a first through hole and a second through hole corresponding to a top of the source contact area and a top of the drain contact area respectively on the first inter layer dielectric and the second inter layer dielectric; and forming a source and a drain on the second inter layer dielectric, and electrically connecting the source and the drain to the source contact area and the drain contact area of the active layer through the first through hole and the second through hole respectively to form the TFT substrate;

step S20, forming a passivation layer covering the source and the drain on the second inter layer dielectric of the TFT substrate, and etching the passivation layer to form a via hole corresponding to a top of the source;

forming a planarization layer on the passivation layer, and forming a second via hole on the planarization layer by photolithography process, wherein the first via hole and the second via hole are vertically and correspondingly connected to each other and jointly form a third through hole;

step S30, forming an anode of an OLED, the anode of the OLED is in contact with the source through the third through hole;

step S40, forming a pixel defining layer on the planarization layer and the anode of the OLED, and forming an opening corresponding to a top of the anode of the OLED on the pixel defining layer by photolithography process;

step S50, forming an organic light emitting layer on the anode of the OLED in the opening;

step S60, forming a cathode on the organic light emitting layer in the pixel defining layer and the opening.

2. The manufacturing method of an OLED panel according to claim 1, wherein the silicon oxynitride is prepared by a chemical vapor deposition method, the reaction gas comprises silane, ammonia and nitrous oxide; the silicon oxide is prepared by a chemical vapor deposition method, the reaction gas comprises silane and nitrous oxide.

3. The manufacturing method of an OLED panel according to claim 1, wherein a thickness of the first inter layer dielectric is less than a thickness of the second inter layer dielectric.

4. The manufacturing method of an OLED panel according to claim 3, wherein the thickness of the first inter layer dielectric is 100 Å-500 Å, and the thickness of the second inter layer dielectric is 3000 Å-10000 Å.

5. The manufacturing method of a TFT substrate according to claim 1, wherein the step S2 comprises:

forming the gate insulating layer covering the active layer on the buffer layer, and depositing a gate metal layer on the gate insulating layer;

forming a photoresist layer on the gate metal layer, patterning the photoresist layer by photolithography process, and defining a gate pattern on the gate metal layer by the remaining photoresist layer;

using the photoresist layer as a barrier layer, and etching the gate metal layer to form the gate corresponding to a top of the active layer;

etching the gate insulating layer by using the photoresist layer and the gate as a barrier, leaving only a portion corresponding to a bottom of the gate, removing the other portions by etching, and defining the channel area corresponding to the bottom of the gate insulating layer, and the source contact area and the drain contact area locating on both sides of the channel area respectively on the active layer by the gate and the gate insulating layer, wherein the remaining gate insulating layer is located on the active layer and aligned with the gate;

performing a plasma treatment on the active layer by using the photoresist layer, the gate and the gate insulating layer as a barrier layer, so that the metal oxide semiconductor material of the source contact area and the drain contact area becomes a conductor, the metal oxide semiconductor material of the channel area maintains the semiconductor characteristics; and removing the photoresist layer after the plasma treatment process is completed.

* * * * *